United States Patent
Chun

(10) Patent No.: US 7,859,880 B2
(45) Date of Patent: Dec. 28, 2010

(54) SEMICONDUCTOR MEMORY APPARATUS

(75) Inventor: Jun-Hyun Chun, Ichon (KR)

(73) Assignee: Hynix Semiconductor Inc. (KR)

( * ) Notice: Subject to any disclaimer, the term of this patent is extended or adjusted under 35 U.S.C. 154(b) by 188 days.

(21) Appl. No.: 12/167,090

(22) Filed: Jul. 2, 2008

(65) Prior Publication Data

US 2009/0019199 A1    Jan. 15, 2009

(30) Foreign Application Priority Data

Jul. 10, 2007    (KR) .................. 10-2007-0069268

(51) Int. Cl.
*G06F 13/00* (2006.01)
(52) U.S. Cl. .......................... 365/63; 365/51
(58) Field of Classification Search .............. 365/63, 365/51, 52
See application file for complete search history.

(56) References Cited

U.S. PATENT DOCUMENTS

| | | | |
|---|---|---|---|
| 6,125,070 A * | 9/2000 | Tomishima | 365/230.03 |
| 6,396,747 B2 | 5/2002 | Kubo et al. | |
| 7,054,178 B1 | 5/2006 | Shiah et al. | |
| 7,139,211 B2 | 11/2006 | Kim et al. | |
| 2003/0193832 A1 * | 10/2003 | Okuyama et al. | 365/230.03 |
| 2005/0138269 A1 | 6/2005 | Kang | |
| 2005/0201134 A1 | 9/2005 | Hartmann | |

FOREIGN PATENT DOCUMENTS

| | | |
|---|---|---|
| JP | 2000048566 | 2/2000 |
| JP | 2005-216434 | 8/2005 |
| KR | 1020010078194 | 8/2001 |
| KR | 1020060084046 | 7/2006 |

* cited by examiner

*Primary Examiner*—Hoai V Ho
*Assistant Examiner*—James G Norman
(74) *Attorney, Agent, or Firm*—Baker & McKenzie LLP

(57) ABSTRACT

A semiconductor memory apparatus includes a first memory cell region including a plurality memory cells; a second memory cell region including a plurality memory cells, the second memory cell region positioned adjacent to the first memory cell region; a sub-local data bus coupled with some of the plurality of memory cells in each of the first and second memory cell regions, the sub-local data bus configured to execute data I/O operations of the first and second memory cell regions; a data bus region disposed between the first and second memory cell regions; a first local data bus disposed within the data bus region and configured to execute data I/O operations in conjunction with the sub-local data bus and a first data I/O sense amplifier; and a second local data bus also disposed within the data bus region and also configured to execute data I/O operations in conjunction with the sub-local data bus and a second data I/O sense amplifier.

20 Claims, 4 Drawing Sheets

SEMICONDUCTOR MEMORY APPARATUS

CROSS-REFERENCES TO RELATED PATENT APPLICATION

This application claims the benefit under 35 U.S.C 119(a) of Korean Application No. 10-2007-0069268, filed on Jul. 10, 2007, in the Korean Intellectual Property Office, the disclosure of which is incorporated herein in its entirety by reference as if set forth in full.

BACKGROUND

1. Technical Field

The embodiments described herein relate to a semiconductor memory apparatus and, more particularly, to a semiconductor memory apparatus capable of increasing an area margin.

2. Related Art

A conventional DRAM (Dynamic Random Access Memory) stores data through a plurality of memory cells, each of which includes one transistor and one capacitor. Each memory cell is coupled to a word line and bit lines. The word line is coupled to a sub-word line driver and the bit lines are coupled to a bit line sense amplifier.

The bit lines are grouped into pairs and data is loaded on to pairs of bit lines. The data loaded on a pair of the bit lines have opposite phases with each other. Each pair of bit lines is coupled to a pair of sub-local data buses and the sub-local data buses are coupled to a pair of local data lines. Data bus switches are disposed between a pair of local data buses and a pair of the sub-local data buses. Each pair of local data buses communicates with a global data bus through a data I/O (input/output) sense amplifier.

A memory cell region can be defined by a set of memory cells coupled to the pair of the sub-local data buses, which is a minimum unit area which is defined by dividing a memory block having a plurality of memory cells based on the pair of the sub-local data buses and the pair of the local data buses. A memory bank is then constructed from associated a plurality of the sub-local data buses, the local data buses and the memory cell regions.

FIG. 1 is a block diagram illustrating a conventional semiconductor memory apparatus. More specifically, a memory block that includes a plurality of memory cell regions 10 is shown in FIG. 1. Particularly, sixteen memory cell regions are exemplarily shown in FIG. 1.

As shown in FIG. 1, the memory block of the conventional semiconductor memory apparatus includes memory cell regions 10, sub-local data buses 1, local data buses 2a to 2d, data bus switches 3 and data I/O sense amplifiers 20a to 20d.

The sub-local data buses 1 perform data I/O operations within the memory cell regions 10. The local data buses 2a to 2d perform data I/O operations with the sub-local data buses 1. The data bus switches 3 are disposed between the sub-local data buses 1 and the local data buses 2a to 2d to selectively switch between these bus lines. The data I/O sense amplifiers 20a to 20d amplify data transmitted from the local data buses 2a to 2d.

Still referring to FIG. 1, each sub-local data bus 1 is composed of a pair of a positive line and a negative line. Each of the local data buses 2a to 2d are also composed of a positive line and a negative line. AS can be seen, the sub-local data buses 1 and the local data buses cross each other at the upper right hand corners of the memory cell regions 10.

Insulating regions 4 are provided between the sub-local data buses 1 so that a data transmission region is defined within the memory block. Each of the sub-local data buses 1 can perform data I/O operations for two memory cell regions 10. The data bus switches 3 selectively connect the sub-local data buses 1 to the local data buses 2a to 2d in response to address signals. As can be seen, each local data bus line 2a to 2d can be configured to perform data I/O operations for 4 memory cell regions 10. Each of the local data buses 2a to 2d is then coupled to one of the data I/O sense amplifiers 20a to 20d.

Referring to FIG. 2, a bit line sense amplifier block 30 and a sub-word line driver block 40 are arranged on the outskirts of the memory cell region 10. Sub-word line drivers (not shown) provided in the sub-word line driver block 40 carry out a function of reinforcing voltages applied to the plurality of word lines in the memory cell region 10. The bit line sense amplifier block 30, which is also coupled to the memory cell region 10, amplifies I/O data on bit lines (not shown) disposed between the memory cell region 10 and the sub-local data buses 1. Again, as can be seen, the associated sub-local data bus pair 1 is coupled to the local data bus pair 2a.

As integration increases, the space allocated for each memory cell region is reduced, and it is becoming increasingly difficult to ensure a sufficient area margin using conventional fabrication techniques and circuit designs.

SUMMARY

A semiconductor memory apparatus capable of providing a sufficient memory cell region area margin is described herein.

According to one aspect, a semiconductor memory apparatus comprises a first memory cell region including a plurality memory cells; a second memory cell region including a plurality memory cells, the second memory cell region positioned adjacent to the first memory cell region; a sub-local data bus coupled with some of the plurality of memory cells in each of the first and second memory cell regions, the sub-local data bus configured to execute data I/O operations of the first and second memory cell regions; a data bus region disposed between the first and second memory cell regions; a first local data bus disposed within the data bus region and configured to execute data I/O operations in conjunction with the sub-local data bus and a first data I/O sense amplifier; and a second local data bus also disposed within the data bus region and also configured to execute data I/O operations in conjunction with the sub-local data bus and a second data I/O sense amplifier.

According to another aspect, a semiconductor memory apparatus comprises a memory cell region comprising a plurality of memory cells; a first sub-local data bus coupled with some of the plurality of memory cells, the first sub-local data bus configured to perform a data I/O operation for the memory cells; a second sub-local data bus coupled with some of the plurality of memory cells, which are not coupled with the first sub-local data bus, the second sub-local data bus configured to perform a data I/O operation for the memory cells; and an insulating region disposed between the first and second sub-local data buses, the insulating area configured to electrically isolate the first sub-local data bus from the second sub-local data bus.

According to still another aspect, a semiconductor memory apparatus comprises a first memory cell region including a plurality memory cells; a first data I/O sense amplifier configured to perform a data I/O operation through a first sub-local data bus connected to some of the plurality of memory cells and a first local data bus connected to the first sub-local data bus; and a second data I/O sense amplifier configured to perform a data I/O operation through a first sub-local data bus connected to some of the plurality of memory cells, which are not coupled with the first sub-local data bus, and a first local data bus connected to the first sub-local data bus.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
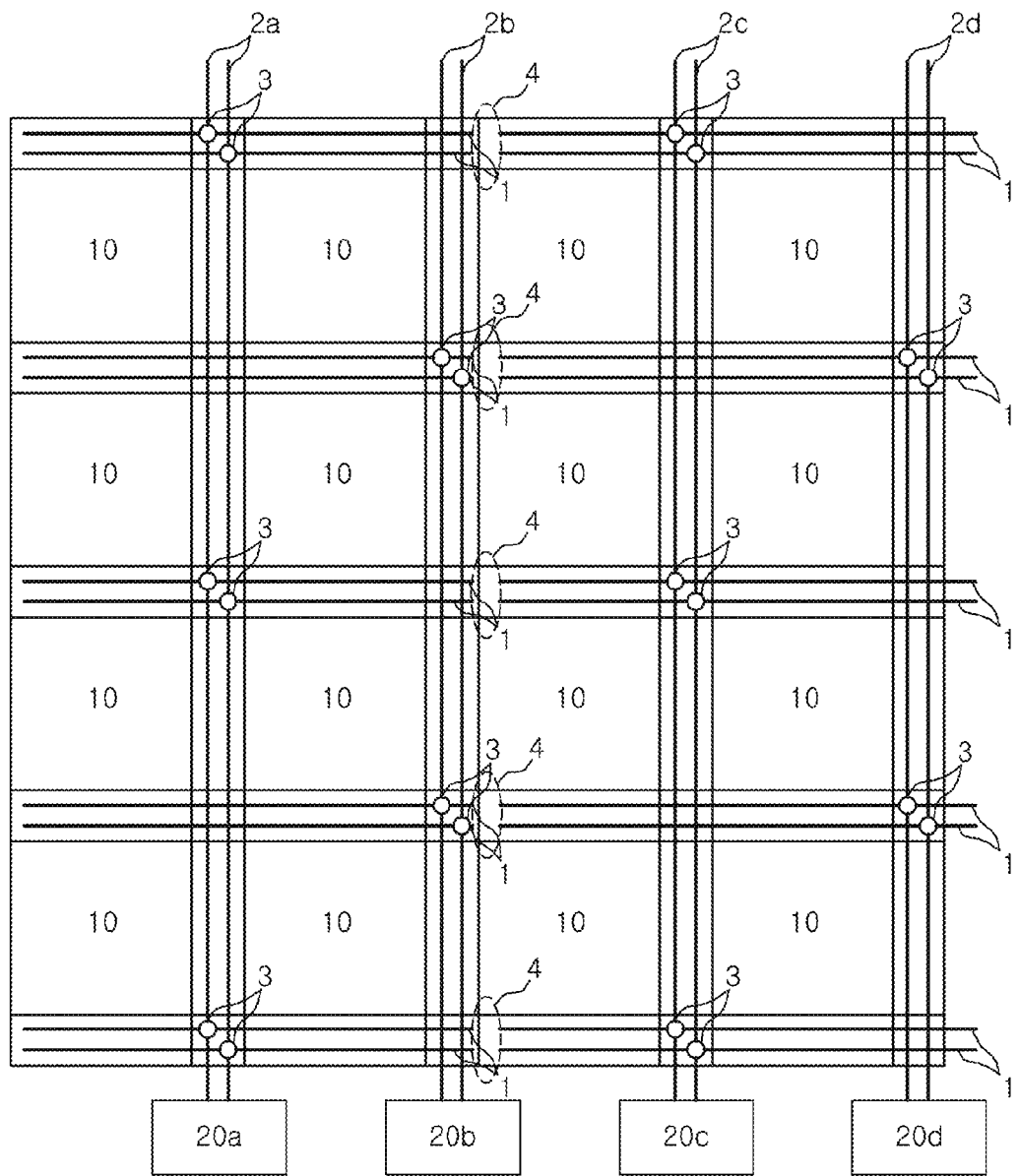
FIG. 1 is a block diagram illustrating a memory block of a conventional semiconductor memory apparatus.
Figure 2:
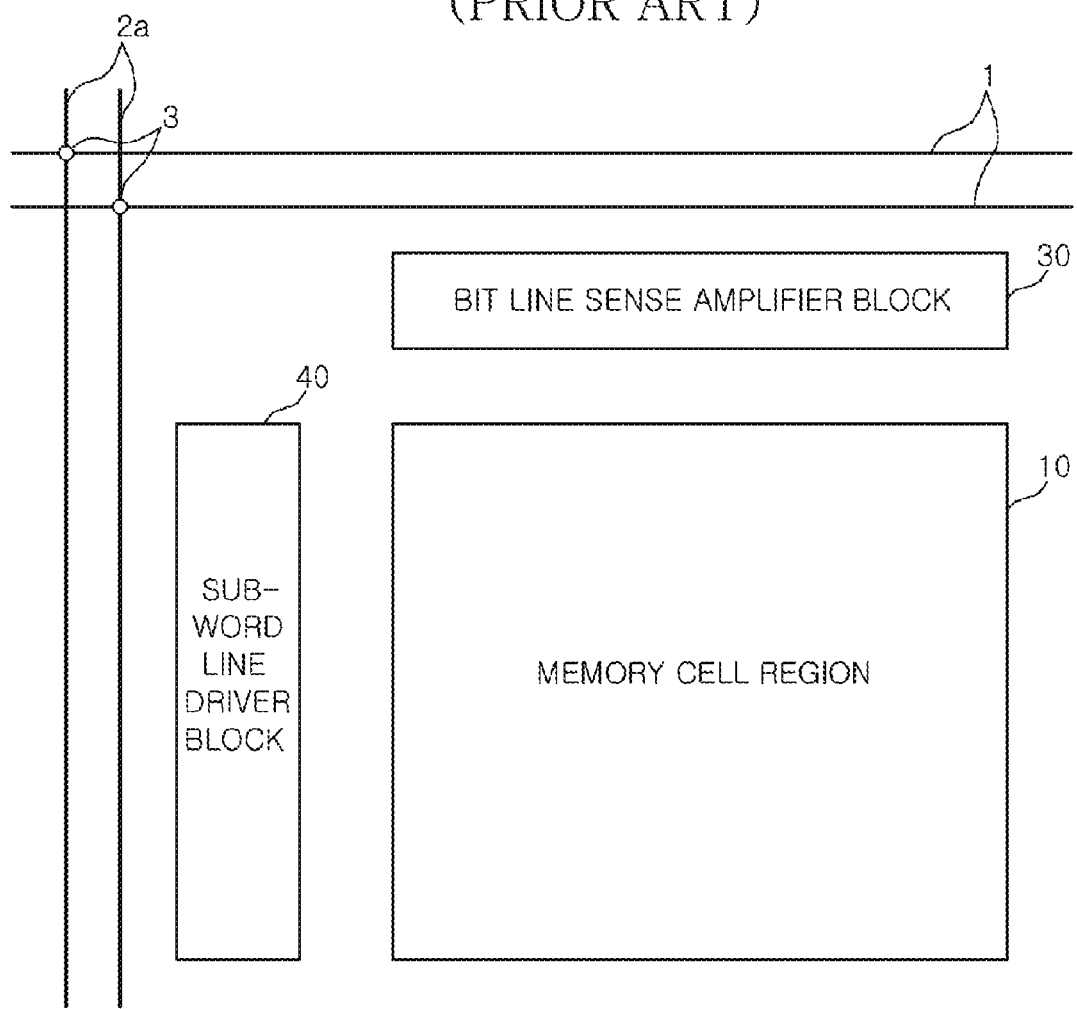
FIG. 2 is a layout of a memory cell region included in the semiconductor apparatus shown in FIG. 1.
Figure 3:
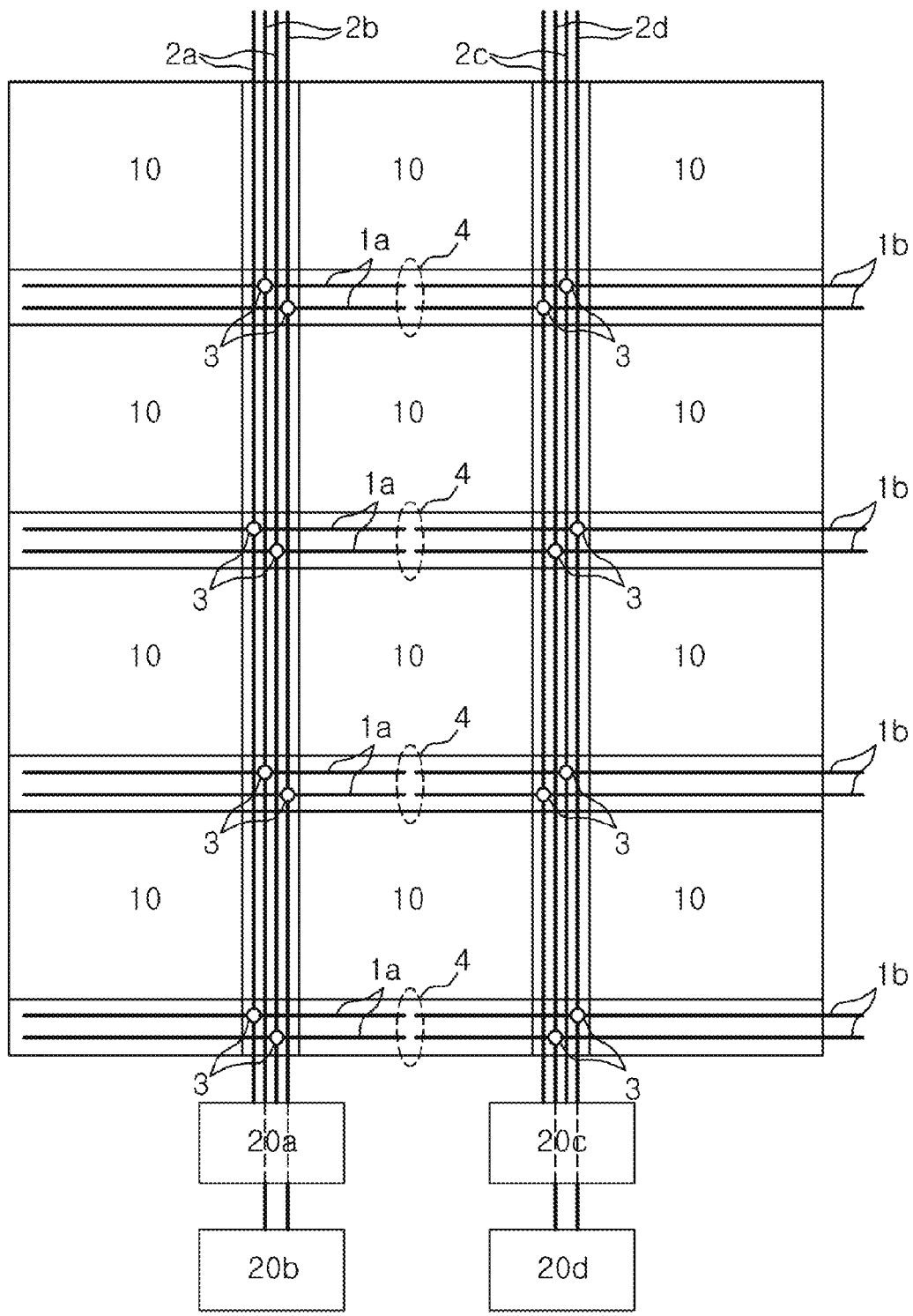
FIG. 3 is a block diagram illustrating a memory block of a semiconductor memory apparatus according to one embodiment.

FIG. 3 is a diagram illustrating an example memory block 11 that can be included in a semiconductor memory apparatus in accordance with one embodiment. The number of memory cells in the memory blocks of FIG. 3 is the same as that in the memory block of FIG. 1.

As shown in FIG. 3, the memory block 11 can include, e.g., twelve memory cell regions 10. Each of the memory cell regions 10 can be disposed in regions defined by sub-local data buses 1a and 1b and local data buses 2a to 2d, which cross each other, e.g., at the upper right hand corners of memory cell regions 10.

Each of the local data buses 2a to 2d is composed of a pair of a positive line and a negative line. The local data buses 2a to 2d can be arranged in such a manner that two pairs of the local data buses 2a and 2b (or 2c and 2d) are disposed between the memory cell regions 10. For example, the positive line of the local data bus 2a, the positive line of the local data bus 2b, the negative line of the local data bus 2a and the negative line of the local data bus 2b can be disposed alternately as illustrated.

Accordingly, the data I/O sense amplifiers 20a to 20d can be disposed in such a manner that two data I/O sense amplifiers are positioned above and below each other as illustrated. In other words, since two local data bus lines, such as 2a to 2d, can be positioned within one area between adjacent memory cell regions 10, the sense amplifiers corresponding to these two local data bus lines, in this case sense amplifiers 20a and 20b, should be positioned beneath, i.e., toward the bottom, of the area in which the local data bus lines reside.

It will be recognized that in other embodiments, the sense amplifiers can be toward the top of the regions in which the associated local data bus lines reside. It will also be recognized that the key in this regard is not the position or exact arrangement of the sense amplifiers, but rather that the sense amplifiers be positioned such that they can be interfaced with the local data bus lines while requiring a minimum layout area and connection length.

As shown in FIG. 3, the sub-local data buses 1a, 1b are separated from each other, e.g., in the middle of the memory block 11 by insulating regions 4. Due to the above mentioned arrangement, for example, some of the memory cells included in one of these four memory cell regions 10 perform the data I/O operation with one of the data I/O sense amplifiers 20a to 20d and the others perform the data I/O operation with another of the data I/O sense amplifiers 20a to 20d.

Relative to a conventional memory block layout, the area margin of the memory block 11 is improved because the area needed for the local data buses 2a to 2d between the memory cell regions 10 can be considerably reduced by using the configuration illustrated in FIG. 3. While the total number of memory cells in the memory block 11 is not changed, the above-mentioned arrangement creates the high density configuration of the memory cells because much more memory cells can be included in one memory cell region 10. More specifically, the arrangement illustrated in FIG. 3 reduces the number of sub-word line drivers that need be provided to each memory cell region. Thus, higher density can be achieved, while still ensuring sufficient area margin.

Figure 4:
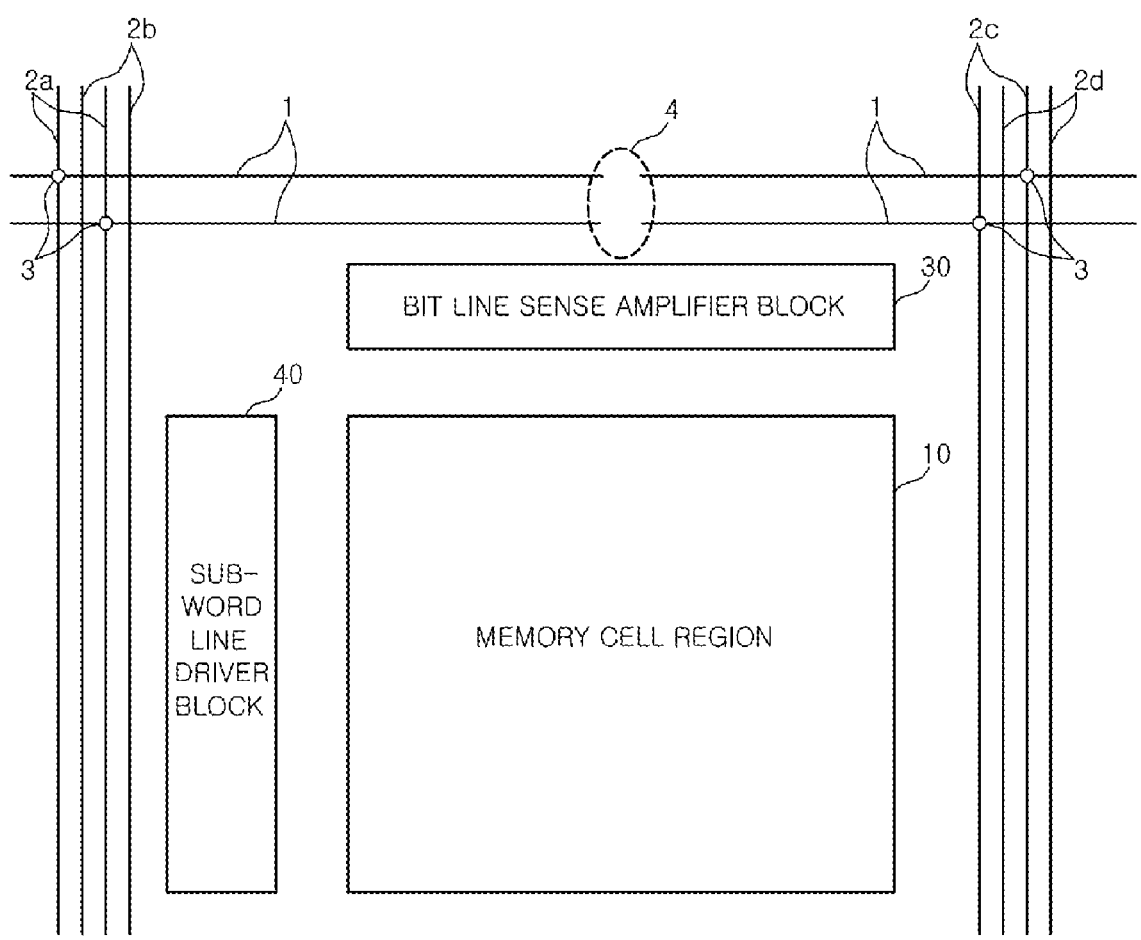
FIG. 4 is a layout of a memory cell region that can be included in the semiconductor memory apparatus shown in FIG. 3.

FIG. 4 is diagram illustrating a layout of an example memory cell region 10 in accordance with one embodiment. More specifically, one of the four memory cell regions 10, which are positioned in the middle of the twelve memory cell regions 10 shown in FIG. 3, is shown In FIG. 4.

Referring to FIG. 4, the memory cell region 10 can be disposed between a sense amplifier block 30 and a sub-word line driver block 40. Assuming that the memory cell region 10 consists of (M×N) number of the memory cells, the sub-word line driver block 40 can consist of M (M is integer) number of the sub-word line drivers and the bit line sense amplifier block 30 can consist of N(N is integer) number of the bit line sense amplifiers.

In the present invention, the memory cells in the memory cell region 10 has more density and the number of the memory cells included in the memory cell region 10 can be more increased, as compared with the memory cells in the conventional memory cell region. That is, in the memory cell region 10 consisting of (M×N) number of the memory cells, the number of M can be increased in the present invention.

Therefore, each of the sub-word line drivers, which are included in the sub-word line driver block 40 according to the present invention, applies a voltage to a large number of the word lines of the memory cells, as compared with a conventional word line driver block. Since the occupied area of the bit line sense amplifier block 30 is not varied but the occupied area of the sub-word line driver block 40 is decreased, the whole occupied area of the memory cell block is decreased.

The memory cell region 10 performs the data I/O operation with two sub-local data buses 1a and 1b e.g., the sub-local data buses 1a and 1b on either side of the insulating region 4. That is, one memory cell region 10 performs the data I/O operation with two pairs of sub-local data buses 1a and 1b and two pairs of local data buses, e.g., local data buses 2a and 2c, providing flexibility in the memory cell arrangement.

As apparent from the above, a memory apparatus configured according to the embodiments described herein can reduces the occupied area of a memory block by alternately arranging two pairs of the local data buses between memory cell regions, which reduces the area needed for the local data buses and reduces the number of sub-word line drivers. As the area of the memory cell region is increased, the memory cells included in the memory cell region is closely arranged. Since the number of memory cells controlled by one sub-word line driver is increased, the total number of sub-word line drivers is decreased. The increasing of the area margin in the memory block of the semiconductor memory apparatus can provide the basis of the highly integrated semiconductor memory apparatus.

While certain embodiments have been described above, it will be understood that the embodiments are only for illustrative purposes. Accordingly, the systems and methods described herein should not be limited based on the described embodiments. Rather, the system and methods described herein should only be limited in light of the claims that follow when taken in conjunction with the above description and accompanying drawings.

What is claimed is:

1. A semiconductor memory apparatus comprising:
a first memory cell region including a plurality memory cells;
a second memory cell region including a plurality memory cells, the second memory cell region positioned adjacent to the first memory cell region;
a sub-local data bus coupled with some of the plurality of memory cells in each of the first and second memory cell regions, the sub-local data bus configured to execute data I/O operations of the first and second memory cell regions;
a data bus region disposed between the first and second memory cell regions;
a first local data bus disposed within the data bus region and configured to execute data I/O operations in communication with the sub-local data bus and a first data I/O sense amplifier; and
a second local data bus also disposed within the data bus region and also configured to execute data I/O operations in communication with the sub-local data bus and a second data I/O sense amplifier.

2. The semiconductor memory apparatus of claim 1, wherein each of the sub-local data bus and the first and second local data buses is composed of a positive line and a negative line.

3. The semiconductor memory apparatus of claim 2, wherein the lines of the first local data bus and the lines of the second local data bus are alternately disposed within the data bus region.

4. The semiconductor memory apparatus of claim 1, wherein each of the first and second memory cell regions comprises a bit line sense amplifier block connected to a plurality of bit lines.

5. The semiconductor memory apparatus of claim 1, wherein each of the first and second memory cell regions comprises a sub-word line driver block connected to a plurality of sub-word lines.

6. The semiconductor memory apparatus of claim 1, further comprising:
a plurality of memory cell regions, each including a plurality of memory cells, the plurality of memory cell regions disposed in rows and columns;
a plurality of sub-local data buses coupled with the plurality of memory cells in each of the plurality of memory cell regions, the plurality of sub-local data buses configured to execute data I/O operations of the plurality of memory cell regions;
a plurality of data bus regions disposed between the columns of the plurality of memory cell regions; and
a plurality of local data buses disposed within the plurality of data bus regions, wherein at least two of the plurality of local data buses are disposed within each of the plurality of data bus regions, each of the plurality of local data buses configured to execute data I/O operations in conjunction with the plurality of sub-local data bus lines.

7. A semiconductor memory apparatus comprising:
first to third memory cell regions comprising a plurality of memory cells, respectively;
a first sub-local data bus coupled with some of the plurality of memory cells of the second memory cell region and the plurality of the memory cells of the first memory cell region, the first sub-local data bus configured to perform a data I/O operation for the memory cells;
a second sub-local data bus coupled with some of the plurality of memory cells of the second memory cell region which are not coupled with the first sub-local data bus and the plurality of the memory cells of the third memory cell region, the second sub-local data bus configured to perform a data I/O operation for the memory cells; and
an insulating region disposed between the first and second sub-local data buses, the insulating area configured to electrically isolate the first sub-local data bus from the second sub-local data bus.

8. The semiconductor memory apparatus of claim 7, wherein each of the first and second sub-local data buses is composed of a positive line and a negative line.

9. The semiconductor memory apparatus of claim 8, further comprising a first local data bus coupled with the first sub-local data bus and configured to perform data I/O operations in conjunction with the first sub-local data bus, and a second local data bus coupled with the second sub-local data bus, the second data bus configured to perform data I/O operations in conjunction with the first sub-local data bus.

10. The semiconductor memory apparatus of claim 9, wherein each of the first and second local data buses is composed of a positive line and a negative line.

11. The semiconductor memory apparatus of claim 7, further comprising a first data I/O sense amplifier coupled with the first local data bus, and a second data I/O sense amplifier coupled with the second local data bus.

12. The semiconductor memory apparatus of claim 7, further comprising a bit line sense amplifier block and a plurality of bit lines, and wherein the second memory cell region is coupled with the bit line sense amplifier block through the plurality of bit lines.

13. The semiconductor memory apparatus of claim 7, further comprising a sub-word line driver block and a plurality of word lines, and wherein the second memory cell region is coupled with the sub-word line driver block through the plurality of word lines.

14. The semiconductor memory apparatus of claim 7, further comprising:
a plurality of memory cell regions, each including a plurality memory cells, the plurality of memory cell regions disposed in rows and columns;
a plurality of sub-local data buses coupled with the plurality of memory cells in each of the plurality of memory cell regions, the plurality of sub-local data buses configured to execute data I/O operations of the plurality of memory cell regions;
a plurality of data bus regions disposed between the columns of the plurality of memory cell regions; and
a plurality of local data buses disposed within the plurality of data bus regions, wherein at least two of the plurality of local data buses are disposed within each of the plurality of data bus regions, each of the plurality of local data buses configured to execute data I/O operations in conjunction with the plurality of sub-local data bus lines.

15. A semiconductor memory apparatus comprising:
first and second memory cell regions, each including a respective plurality memory cells;

a first data I/O sense amplifier configured to perform a data I/O operation through a first sub-local data bus connected to some of the plurality of memory cells of the first memory cell region, and a first local data bus connected to the first sub-local data bus; and a second data I/O sense amplifier configured to perform a data I/O operation through a second sub-local data bus connected to some of the plurality of memory cells of the second memory cell region, which are not coupled with the first sub-local data bus, and a second local data bus connected to the second sub-local data bus, wherein lines of the first local data bus and lines of the second local data bus are alternately disposed.

16. The semiconductor memory apparatus of claim 15, wherein each of the first and second sub-local data bus and the first and second local data buses is composed of a positive line and a negative line.

17. The semiconductor memory apparatus of claim 15, further comprising a bit line sense amplifier block, and wherein the memory cell region is coupled to the bit line sense amplifier block through a plurality of bit lines.

18. The semiconductor memory apparatus of claim 15, further comprising a sub-word line driver block, and wherein the memory cell region is coupled to the sub-word line driver block through a plurality of sub-word lines.

19. The semiconductor memory apparatus of claim 15, further comprising:
a plurality of memory cell regions, each including a plurality memory cells, the plurality of memory cell regions disposed in rows and columns;
a plurality of sub-local data buses coupled with the plurality of memory cells in each of the plurality of memory cell regions, the plurality of sub-local data buses configured to execute data I/O operations of the plurality of memory cell regions;
a plurality of data bus regions disposed between the columns of the plurality of memory cell regions; and
a plurality of local data buses disposed within the plurality of data bus regions, wherein at least two of the plurality of local data buses are disposed within each of the plurality of data bus regions, each of the plurality of local data buses configured to execute data I/O operations in conjunction with the plurality of sub-local data bus lines.

20. The semiconductor memory apparatus of claim 15, further comprising a third sub-local data bus connected to some of the plurality of memory cells of the first memory cell region that are not connected to the first sub-local data bus, and an insulation area disposed between the first and third sub-local data buses, the insulation area configured to isolate the first and third sub-local data buses from each other.

* * * * *